(12) United States Patent
Chin et al.

(10) Patent No.: US 12,204,388 B2
(45) Date of Patent: Jan. 21, 2025

(54) COOLING DETECTION AND PROFILE FOR SYSTEM OPTIMIZATION

(71) Applicant: Dell Products L.P., Round Rock, TX (US)

(72) Inventors: Jordan Chin, Austin, TX (US); Isaac Q. Wang, Austin, TX (US)

(73) Assignee: Dell Products L.P., Round Rock, TX (US)

(*) Notice: Subject to any disclaimer, the term of this patent is extended or adjusted under 35 U.S.C. 154(b) by 387 days.

(21) Appl. No.: 17/852,612

(22) Filed: Jun. 29, 2022

(65) Prior Publication Data

US 2024/0008216 A1   Jan. 4, 2024

(51) Int. Cl.
*G06F 1/20* (2006.01)
*G05D 23/01* (2006.01)
*H05K 7/20* (2006.01)

(52) U.S. Cl.
CPC .......... *G06F 1/206* (2013.01); *G05D 23/015* (2013.01); *H05K 7/20145* (2013.01); *H05K 7/20209* (2013.01)

(58) Field of Classification Search
CPC .......... H05K 7/20209; H05K 7/20145; H05K 7/20727; G05D 23/015; G06F 1/206
See application file for complete search history.

(56) References Cited

U.S. PATENT DOCUMENTS

| | | | | |
|---|---|---|---|---|
| 7,826,215 | B2 * | 11/2010 | Glover | H05K 7/20727 361/679.49 |
| 9,261,930 | B2 * | 2/2016 | Moore | G06F 1/206 |
| 2011/0081851 | A1 * | 4/2011 | Franz | H05K 7/20145 137/1 |
| 2011/0184568 | A1 * | 7/2011 | Tai | G05D 23/1934 700/282 |
| 2014/0011437 | A1 * | 1/2014 | Gosselin | H05K 7/20836 454/154 |

* cited by examiner

*Primary Examiner* — Mong-Shune Chung
(74) *Attorney, Agent, or Firm* — Larson Newman, LLP

(57) ABSTRACT

An information handling system includes an enclosure configured to include a duct to channel air flow in the enclosure over a first component of the information handling system. A duct sensor determines if the duct is included in the enclosure. The system receives an indication from the duct sensor that the duct is not included in the information handling system, determines that the first component is in a hot spot in the enclosure based upon the indication, and redirects a workload instantiated on the first component to a second component of the information handling system.

20 Claims, 3 Drawing Sheets

COOLING DETECTION AND PROFILE FOR SYSTEM OPTIMIZATION

FIELD OF THE DISCLOSURE

This disclosure generally relates to information handling systems, and more particularly relates to providing a cooling detection and profile for optimized operation of an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include an enclosure configured to include a duct to channel air flow in the enclosure over a first component of the information handling system. A duct sensor may determine if the duct is included in the enclosure. The system may receive an indication from the duct sensor that the duct is not included in the information handling system, determine that the first component is in a hot spot in the enclosure based upon the indication, and redirect a workload instantiated on the first component to a second component of the information handling system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
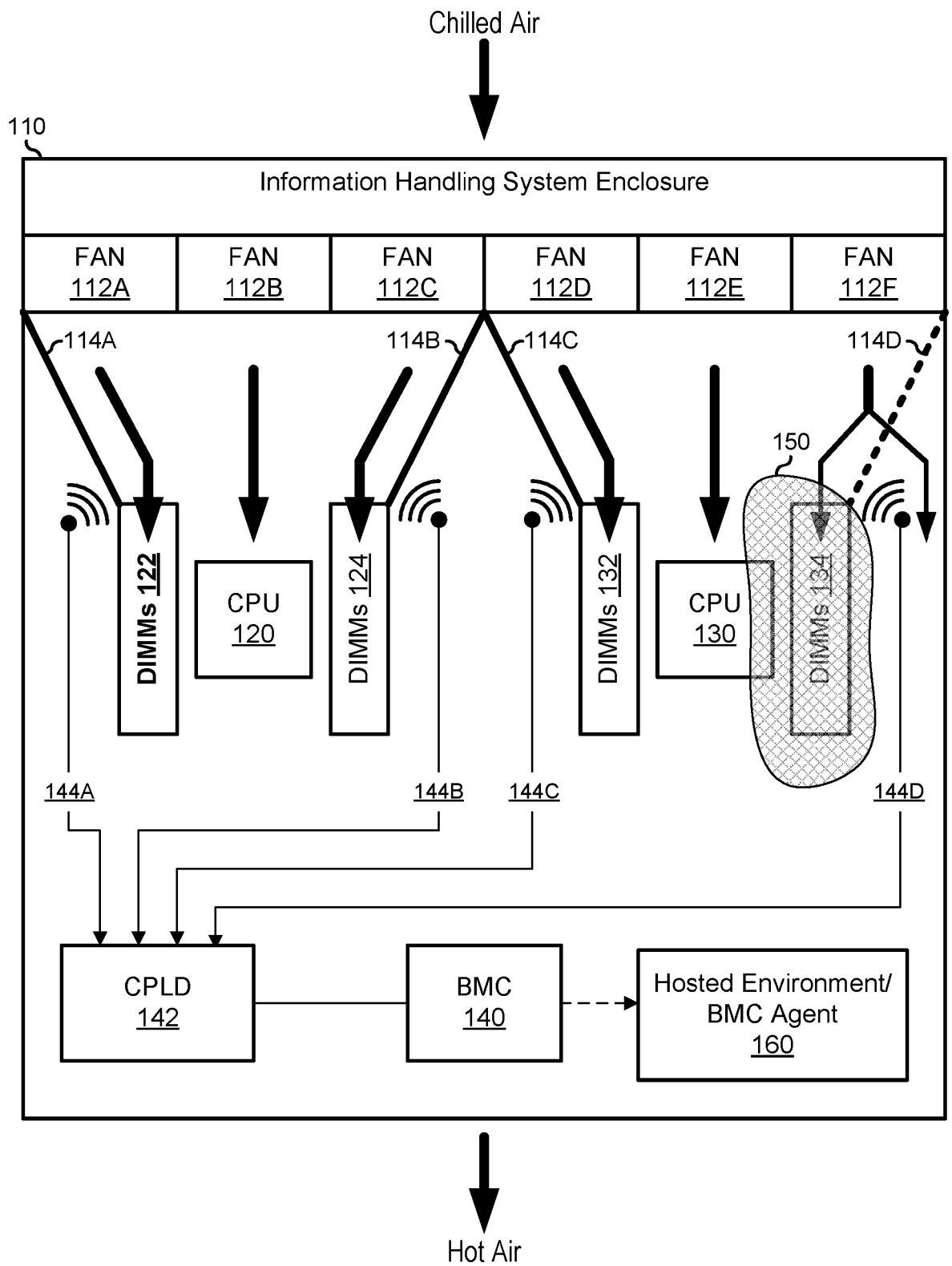
FIG. 1 is a block diagram of an information handling system according to an embodiment of the current disclosure.

FIG. 1 illustrates an information handling system 100, including an information handling system enclosure 110, cooling fans 112, ducts 114, central processing units 120 and 130, Dual In-Line Memory Modules (DIMMs) 122, 124, 132, and 134, a Baseboard Management Controller (BMC) 140, a Complex Programmable Logic Device (CPLD) 142, and duct sensors 144. Information handling system 100 represents a processing system that is typically associated with a high-performance computing (HPC) environment, such as a data center, a cloud processing center, an edge processing center, or the like. In particular, information handling system 100 represents a processing system that is actively managed to provide a peak level of processing performance in a densely packed processing environment where the management of heat generated by the processing components is carefully and continuously monitored. Here, it will be understood that excessive heat within portions of information handling system 100 may adversely affect the performance capabilities of the processing components within the hotter portions.

As such, information handling system 100 is designed and configured to actively manage the cooling of the processing components within the information handling system. In particular, enclosure 110 is designed to draw chilled air from a front side (here, the top side) of the enclosure with multiple cooling fans 112. The chilled air from cooling fans 112 is redirected to the critical heat generating components of information handling system 100 by the placement of one or more ducts 114. As illustrated, information handling system 100 includes six (6) cooling fans, but it should be understood that a greater or a fewer number of cooling fans may be utilized in an information handling system, as needed or desired. further, information handling system 100 is illustrated as including four (4) ducts 114, but it should be understood that a greater or a fewer number of ducts may be utilized in an information handling system, as needed or desired. Moreover, information handling system 100 may include other types of apparatus for directing and shaping the airflow within enclosure 110, such as baffles, louvers, diverters, or other apparatus for directing and shaping airflows, as needed or desired. Further, the critical heat generating components of information handling system 100 are illustrated as including CPUs 120 and 130 and DIMMs 122, 124, 132, and 134. However, it should be understood that other critical heat generating units, including additional CPUs, DIMMS, Graphics Processing Units (GPUs), Field Programmable Gate Arrays (FPGAs), Application Specific Integrated Circuit (ASIC) cards, Network Interface Cards (NICs), power supplies, disk drives, or other components may have ducts located to ensure an adequate supply of chilled air to cool the other heat generating components of information handling system 100, as needed or desired.

In order to ensure that the desired flow of chilled air is maintained across the critical heat generating components of information handling system 100, ducts 114 must all be securely located in their intended positions. For example, a design consideration for information handling system 100 may include that the airflow be ducted to provide a majority of the chilled airflow to CPUs 120 and 130, and DIMMs 122, 124, 132, and 134. Here, in a left hand portion of FIG. 1, fans 112A, 112B, and 112C are providing airflow that is ducted by ducts 114A and 114B toward CPU 120 and DIMMs 122 and 124, thereby providing adequate cooling to the CPU and the DIMMs. However, conditions within information handling system 100 may result in the incorrect distribution of the airflows within enclosure 110. For example, in a right hand portion of FIG. 1, fans 112D, 112E, and 112F are providing airflow, and duct 114C is properly directing the airflow to CPU 130 and DIMMs 132. However, duct 114D is not properly directing the airflow, as indicated by the dashed line representing duct 114D. Duct 114D may be improperly directing the airflow from fan 112F due to the duct being removed, for example during a service of information handling system, and not being reinstalled, due to the duct being improperly affixed or located within enclosure 110, due to defects in the duct such as breaks, tears, or holes in the duct, or due to other deficiencies in the placement or performance of the duct. In any case, the improper airflow created by the deficiencies in duct 114D result in the airflow from fan 112F being improperly directed away from DIMMs 134, thereby creating a hot spot 150 in the vicinity of CPU 130 and DIMMs 134.

In a particular embodiment, duct sensors 144 are configured to detect the presence and proper placement and operation of ducts 114. Here, duct sensors 144 provide signal inputs to CPLD 142 indicating the status of the associated ducts 114. For example, duct sensors 144A, 144B, and 144C may provide indications to CPLD 142 that respective ducts 114A, 114B, and 114C are properly in place, and duct sensor 144D may provide an indication to the CPLD that duct 114D is not functioning properly. In particular, duct sensor 114D may indicate whether duct 114D is in place or not, whether the duct is in place but incorrectly positioned, whether the duct is faulty, or the like. In a another embodiment, duct sensors 144 provide the signal inputs directly to BMC 140, and the BMC processes the signal inputs as described further below. Here, it may be understood that one or more of duct sensors 144 may include a data interface, such as an Inter-Integrated Circuit (I2C) interface or the like in order to save on the use of I/O pins of the BMC.

Duct sensors 144 may represent a wide variety of sensor types, including, but not limited to two-state sensors such as electro-mechanical switches, light sensors, circuit continuity sensors, or the like, as needed or desired. Electro-mechanical switches may be positioned such that when a duct is in place and positioned correctly, a mechanical actuator is moved from a first position to a second position, such that a signal is provided in a first state when the duct is present and correctly positioned, and in a second state when either the associated duct is not present or incorrectly positioned. Light sensors may include a LED emitter and a photosensor, such that the presence of the duct breaks the light path between the LED emitter and the photosensor, providing a presence indication for the duct. Multiple photosensors may be utilized to distinguish between a duct that is present and correctly positioned, and a duct that is present but incorrectly positioned. Circuit continuity sensors may rely on the particular duct being fabricated of a conductive material such as a metallic material or a conductive foam, which, when correctly positioned, completes a circuit path that provides an indication that the duct is present and correctly positioned. Similarly, circuit continuity sensors may rely on the placement of a conductive plate on a surface of the duct that completes the circuit when the duct is present and correctly positioned.

Duct sensors 144 each provide a unique input to CPLD 142. In this way, CPLD 142 can distinguish between the presence or absence of multiple ducts within enclosure 110, and can correlate the particular input from duct sensors 144 with the location of the particular ducts. For example, when duct sensors 144A, 144B, and 144C each indicate that respective ducts 114A, 114B, and 114C are present and correctly positioned, and when duct sensor 144D indicates that duct 114D is either missing or incorrectly positioned, then CPLD 142 determines that duct 144D, being the duct located at the top-right portion of enclosure 110 is not operative to provide proper airflow to the components in the top-right portion of the enclosure. Then, when CPLD 142 determines that one or more ducts 114 are not present or incorrectly positioned, the CPLD communicates with BMC 140 that the relevant ducts are faulty. BMC 140 and CPLD 142 may have a data interface that permit the CPLD to communicate which ducts are missing or incorrectly positioned.

In response, BMC 140 determines that regions of enclosure 110, and particularly, the components within those regions are susceptible to experiencing hot spots. For example, when CPLD 142 receives the indication from duct sensor 144D that duct 114D is missing or incorrectly positioned, and communicates the same to BMC 140, the BMC determines that a hot spot 150 is created by the incorrect airflow, and that the hot spot will impact CPU 130 and DIMMs 134. Information handling system 100, and particularly CPUs 120 and 130 and DIMMs 122, 124, 132, and 134, will operate to instantiate a hosted environment 160, such as an operating system (OS), a virtualized processing environment such as a hypervisor or virtual machine manager (VMM), or another processing environment configured to perform the processing functions to which the information handling system is directed. Further, BMC 140, CPLD 142, and duct sensors 144 will operate to instantiate a management environment that is a separate processing environment from hosted environment instantiated on CPUs 120 and 130, and DIMMs 122, 124, 132, and 134. However, information handling system 100 typically provides a bridging communication function between the hosted environment 160 and the management environment to permit the passing of information between the environments. As such, hosted environment 160 may typically instantiate a management agent that provides an application programming interface (API) that permits BMC 140 to monitor, manage, and maintain various operations of the hosted environment.

When BMC 140 determines that regions of enclosure 110, and the components within those regions, are experiencing hot spots based upon the inputs to CPLD 142 from duct sensors 144, then the BMC communicates to hosted environment 160 that the hot spot exists, and the components that are affected by the hot spot. A hosted environment may include a workload manager that operates to receive workload requests, and to allocate the resources of the information handling system to the associated workloads. A workload manager operates to receive the hot spot information and to allocate the workloads instantiated on hosted environment 160 based upon the hot spot information. For example, the workload manager may determine that a first workload has a higher memory bandwidth requirement than a second workload. The workload manager may allocate the second workload to CPU 130, and allocate memory from a memory range associated with DIMMs 134 based upon the hot spot information associated with hot spot 150, and may allocate the first workload to CPU 120. In another example, where the first workload is already instantiated on CPU 130 and the second workload is already instantiated on CPU 120, the workload manager can operate to migrate the second workload to CPU 130, and to migrate the first workload to CPU 120.

In a particular embodiment, when BMC 140 determines that regions of enclosure 110, and the components within those regions are experiencing hot spots, the BMC operates to send an indication to a management system associated with information handling system 100 of the existence of the hot spots. A system administrator may dispatch a technician to examine information handling system 100 to determine any problems with the placement of ducts 114 within the information handling system, and to replace or otherwise repair any missing, mis-placed, or damaged ducts, as needed or desired.

Figure 2:
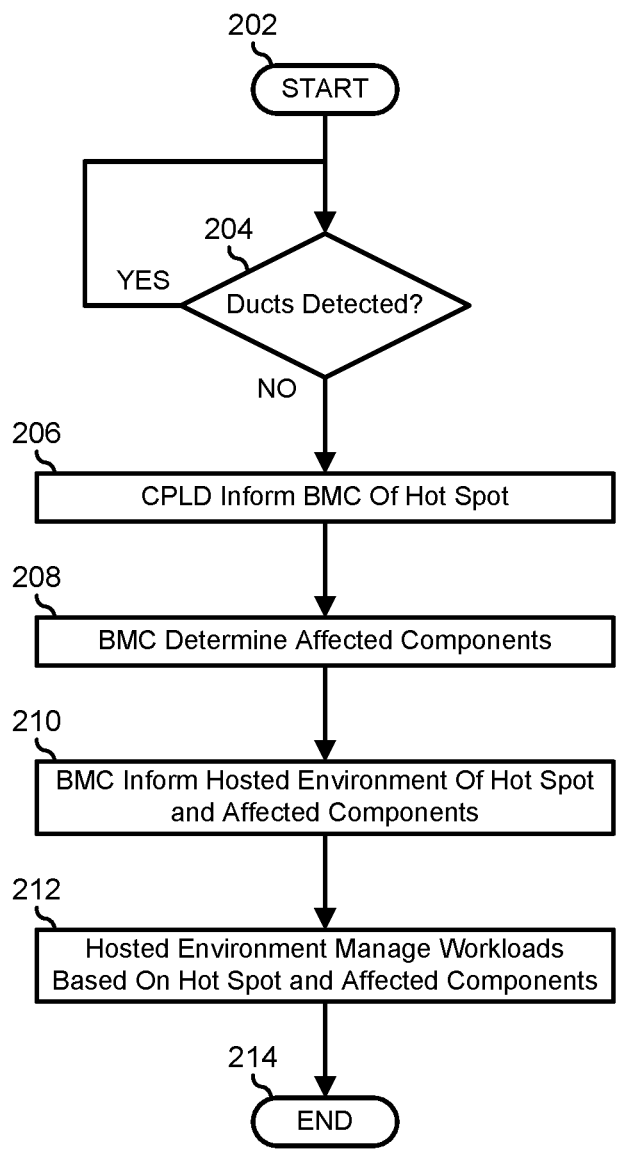
FIG. 2 is a flowchart illustrating a method for providing cooling detection and a profile for optimized operation of an information handling system according to an embodiment of the current disclosure.

FIG. 2 illustrates a method 200 for providing a cooling detection and profile for optimized operation of an information handling system, starting at block 202. A decision is made as to whether all ducts of the information handling system are detected in decision block 204. If so, the "YES" branch of decision block 204 is taken and the method loops back to decision block 204 until such time that a duct is no longer detected, and the "NO" branch of decision 204 is taken. When the "NO" branch of decision block 204 is taken, a CPLD of the information handling system receives an indication from a duct sensor that the duct is no longer detected, and provides an indication to a BMC of the information handling system informing the BMC that the information handling system is experiencing a hot spot, and the location of the hot spot in block 206. The BMC determines which components of the information handling system are affected by the hot spot in block 208, and the BMC provides the hot spot information and the components that are affected by the hot spot to a hosted environment of the information handling system in block 210. The hosted environment manages the workloads instantiated on the hosted environment to maximize and make most efficient use of the resources of the information handling system based upon the hot spot information and the affected components in block 212, and the method ends in block 214.

Figure 3:
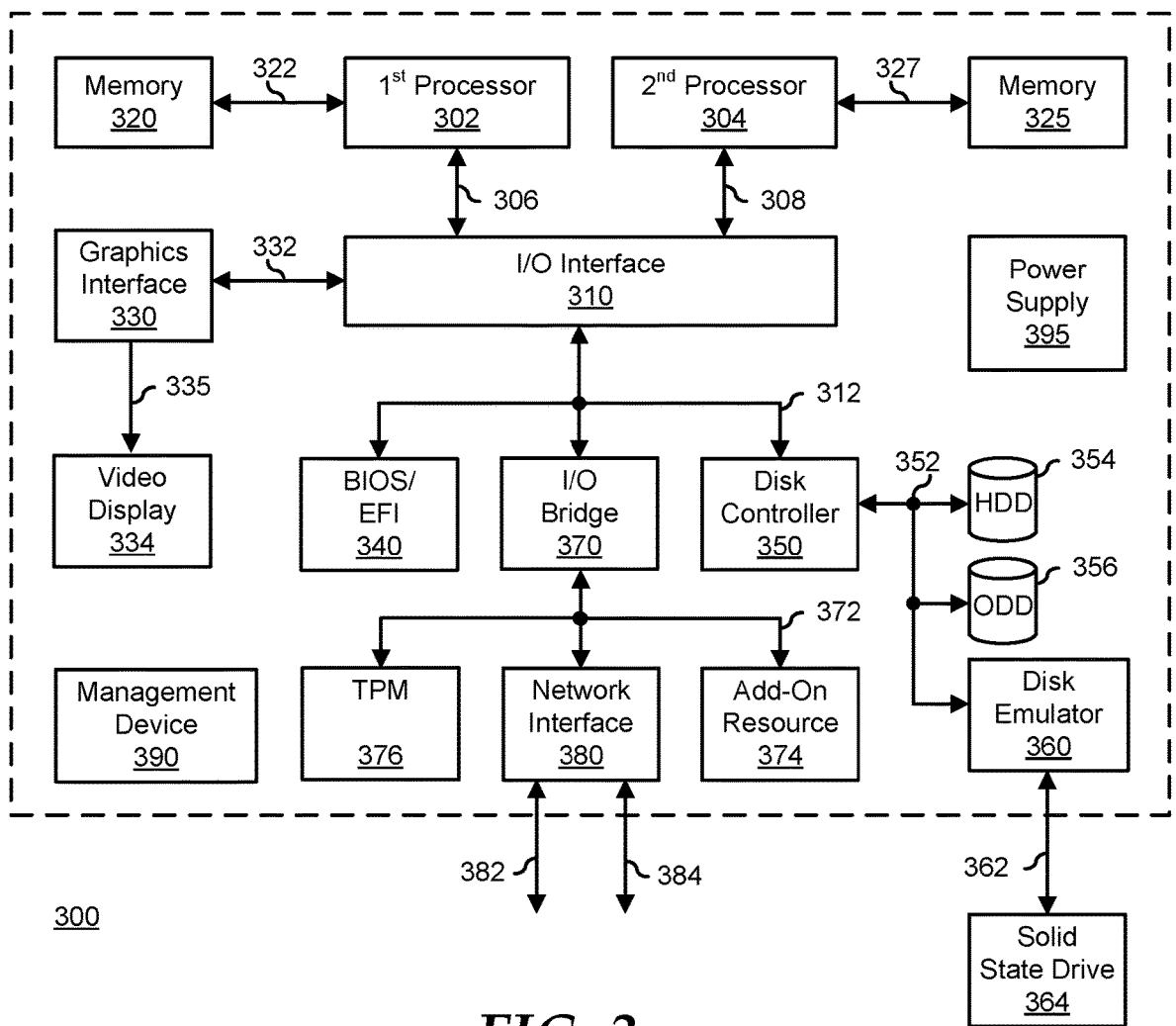
FIG. 3 is a block diagram illustrating a generalized information handling system according to another embodiment of the present disclosure.

FIG. 3 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320 and 325, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 335 to a video display 334. In a particular embodiment, information handling system 300 includes separate memories that are dedicated to each of processors 302 and 304 via separate memory interfaces. An example of memories 320 and 330 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a processor;
an enclosure configured to include a duct to channel air flow in the enclosure over a first component of the information handling system; and
a duct sensor configured to determine if the duct is included in the enclosure;
wherein the processor is configured to receive a first indication from the duct sensor that the duct is not included in the information handling system, to determine that the first component is in a hot spot in the enclosure based upon the first indication, and to redirect a workload instantiated on the first component to a second component of the information handling system.

2. The information handling system of claim 1, further comprising a complex programmable logic device (CPLD) configured to receive a second indication from the duct sensor that the duct is not included in the information handling system.

3. The information handling system of claim 2, further comprising a baseboard management controller (BMC) configured to receive a third indication from the CPLD that the duct is not included in the information handling system.

4. The information handling system of claim 3, wherein the BMC is further configured to identify the hot spot and the first component based upon the third indication.

5. The information handling system of claim 4, wherein the BMC is further configured to provide the first indication to the processor.

6. The information handling system of claim 5, wherein the first indication identifies the hot spot and the first component.

7. The information handling system of claim 1, wherein the duct sensor includes an electro-mechanical switch configured to detect the presence of the duct.

8. The information handling system of claim 1, wherein the duct sensor includes an elector-optical sensor configured to detect the presence of the duct.

9. The information handling system of claim 1, wherein the duct includes an electrically conductive portion, and the duct sensor includes an open circuit that is completed by the conductive portion when the duct is included in the enclosure.

10. The information handling system of claim 9, wherein the conductive portion is an electrically conductive foam.

11. A method, comprising:
providing, in an enclosure of an information handling system, a duct sensor configured to determine if a duct is included in the enclosure, wherein the duct is configured to channel air flow in the enclosure over a first component of the information handling system;
receiving a first indication from the duct sensor that the duct is not included in the information handling system;
determining that the first component is in a hot spot in the enclosure based upon the first indication; and
redirecting a workload instantiated on the first component to a second component of the information handling system.

12. The method of claim 11 further comprising receiving, by a complex programmable logic device (CPLD) of the information handling system, a second indication from the duct sensor that the duct is not included in the information handling system.

13. The method of claim 12 further comprising receiving, by a baseboard management controller (BMC) of the information handling system, a third indication from the CPLD that the duct is not included in the information handling system.

14. The method of claim 13 further comprising identifying, by the BMC, the hot spot and the first component based upon the third indication.

15. The method of claim 14 further comprising providing, by the BMC, the first indication to a processor of the information handling system.

16. The method of claim 15, wherein the first indication identifies the hot spot and the first component.

17. The method of claim 11, wherein the duct sensor includes an electro-mechanical switch configured to detect the presence of the duct.

18. The method of claim 11, wherein the duct sensor includes an elector-optical sensor configured to detect the presence of the duct.

19. The method of claim 11, wherein the duct includes an electrically conductive portion, and the duct sensor includes an open circuit that is completed by the conductive portion when the duct is included in the enclosure.

20. An information handling system, comprising:
a baseboard management controller;
a first processor;
a second processor
an enclosure configured to include a duct to channel air flow in the enclosure over the first processor; and
a duct sensor configured to determine if the duct is included in the enclosure;
wherein the BMC is configured to receive a first indication from the duct sensor that the duct is not included in the information handling system, to determine that the first processor is in a hot spot in the enclosure based upon the first indication, and to redirect a first workload instantiated on the first processor to the second processor.

* * * * *